United States Patent [19]

Suzuki et al.

[11] Patent Number: 4,613,228

[45] Date of Patent: Sep. 23, 1986

[54] SURFACE POTENTIOMETER

[75] Inventors: Koji Suzuki, Yokohama; Yoshihiro Kawatsura, Kawasaki, both of Japan

[73] Assignee: Canon Kabushiki Kaisha, Tokyo, Japan

[21] Appl. No.: 631,643

[22] Filed: Jul. 17, 1984

Related U.S. Application Data

[63] Continuation of Ser. No. 438,302, Oct. 29, 1982, abandoned, which is a continuation of Ser. No. 231,170, Feb. 3, 1981, abandoned, which is a continuation of Ser. No. 969,886, Dec. 15, 1978, abandoned.

[30] Foreign Application Priority Data

Dec. 21, 1977 [JP] Japan .................................. 53-7840

[51] Int. Cl.$^4$ ...................... G03G 15/02; G03G 15/06
[52] U.S. Cl. ................................... 355/14 R; 324/452; 324/457; 355/14 CH; 355/140
[58] Field of Search .................. 355/3 R, 3 CH, 14 R, 355/14 CH, 14 D; 324/452, 455, 457

[56] References Cited

U.S. PATENT DOCUMENTS

| | | | |
|---|---|---|---|
| 3,013,203 | 12/1961 | Allen et al. | 324/455 |
| 3,321,307 | 5/1967 | Urbach | 355/14 E X |
| 3,729,675 | 4/1973 | Vosteen | 324/457 X |
| 3,944,354 | 3/1976 | Benwood et al. | 355/3 R |
| 3,998,538 | 12/1976 | Urso et al. | 355/3 R |
| 4,063,154 | 12/1977 | Andrus et al. | 355/14 R X |
| 4,100,484 | 7/1978 | Buchheit | 355/3 R X |
| 4,106,869 | 8/1978 | Buchheit | 355/3 R |
| 4,127,806 | 11/1978 | Shuey et al. | 324/452 |

Primary Examiner—Fred L. Braun
Attorney, Agent, or Firm—Fitzpatrick, Cella, Harper & Scinto

[57] ABSTRACT

A surface potentiometer having a movable shield member for intermittently shielding a clearance between a measurement electrode and a surface to be measured to cause a potential of the surface to be measured to be induced as an AC signal in the measurement electrode. A voltage greater than or equal to a maximum value of the potential of the surface to be measured or a voltage smaller than or equal to a minimum value of the surface potential is applied as a bias voltage to the shield member to thereby permit discrimination between positive and negative polarities of the surface potential. A rectifier is provided for rectifying the voltage induced in the electrode, and an operational device substracts the bias voltage from the rectified voltage.

21 Claims, 15 Drawing Figures

SURFACE POTENTIOMETER

This is a continuation of application Ser. No. 438,302, filed Oct. 29, 1982, which in turn is a continuation of Ser. No. 231,170, filed Feb. 3, 1981, which in turn is a continuation of Ser. No. 969,886, filed Dec. 15, 1978, all now abandoned.

BACKGROUND OF THE INVENTION

1. Field of the Invention

This invention relates to a surface potentiometer for measuring the surface potential of a surface to be measured. Specifically, it relates to a surface potentiometer suited for a measurement of the surface potential of a photosensitive medium in electrophotographic apparatus.

2. Description of the Prior Art

As a simple means for measuring a surface potential, use has heretofore been made of a method whereby a chopper blade biased to ground potential is rotated between a surface to be measured and a measurement electrode to convert DC potentials of the positive and the negative signs appearing on the surface to be measured at various timings into an alternating current and measure the same. However, when detecting a potential to be measured as an AC signal, the amplitude of the AC signal detected is proportional to a difference between the measured potential of the surface to be measured and the potential of the potentiometer housing, but whether the aforementioned measured potential is in the positive direction or in the negative direction with respect to the housing potential could not be discriminated. Particularly, there has been a problem where the surface potential measured is in both positive and negative directions as in the photosensitive drum of an electrophotographic apparatus.

To eliminate the above-noted disadvantage, it has been thought to discriminate between the positive and the negative of the surface potential by seizing the time when the chopper shields the measurement electrode and the surface to be measured. This is a very effective method, but it involves the necessity of providing the potentiometer with a detector element and circuit for discrimination, and the potentiometer itself has become complicated as well as the circuit.

SUMMARY OF THE INVENTION

In view of the above-noted disadvantages peculiar to the prior art, it is an object of the present invention to provide a surface potentiometer which is simple in construction and which can effect accurate measurement.

It is another object of the present invention to provide a surface potentiometer which can discriminate between the positive and the negative of a surface potential.

It is still another object of the present invention to provide a surface potentiometer which prevents noise from affecting the potentiometer's internal circuitry and also prevents irregularity of the detected potential.

It is yet still another object of the present invention to provide a surface potentiometer suited for a measurement of a potential of a recording medium in electrostatic recording apparatus such as copying apparatus utilizing electrophotography, and also suited for control by measurement output.

These and other objects of the present invention will become readily apparent from the following detailed description of the illustrative embodiments taken in conjunction with the accompanying drawings.

BRIEF DESCRIPTION OF THE DRAWINGS

FIG. 10-1 illustrates the waveforms of the measuring voltage;

FIG. 10-2 illustrates the relation between the surface potential $V_P$ and the peak value of the output at the measurement electrode when a bias voltage $V_B = 150$ V;

DESCRIPTION OF THE PREFERRED EMBODIMENTS

Figure 1:
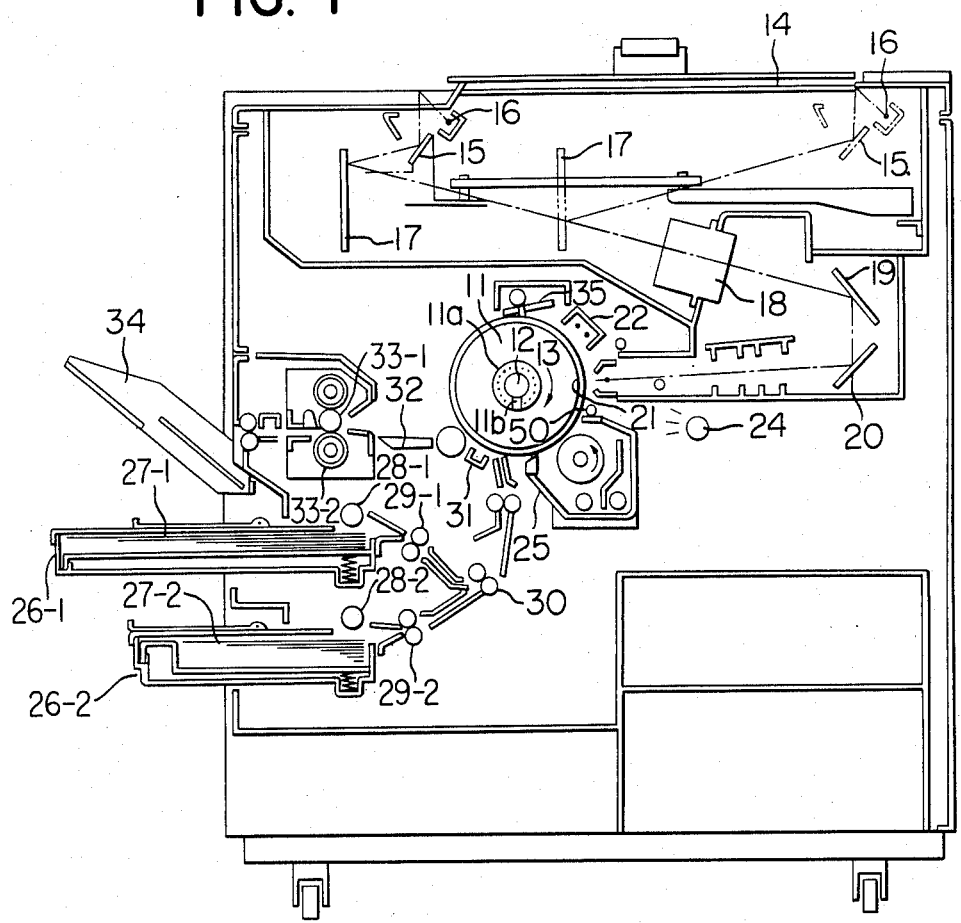
FIG. 1 is a cross-sectional view showing an electrophotographic copying apparatus to which the present invention is applicable.

Referring to FIG. 1, it is a cross-sectional view of electrophotographic copying apparatus to which the present invention is applicable.

The surface of a drum 3 comprises a three-layer photosensitive medium using a CdS photoconductive material. The drum 11 is rotatably mounted on a shaft 12 and starts to rotate in the direction of the arrow in response to a copy instruction.

When the drum 11 is rotated to a predetermined position, an original placed on an original supporting carriage glass plate 14 is illuminated by an illuminating lamp 16 integrally formed with a first scanning mirror 15 and the reflected light from the original is scanned by the first scanning mirror 15 and a second scanning mirror 17. The first 15 and the second scanning mirror 17 are moved at a velocity ratio of 1:½, whereby the scanning of the original is effected with the length of the light path forward of a lens 18 maintained constant at all times.

The reflected light image is focused on the drum 11 at an exposure station 21 via the lens 18, a third mirror 19 and a fourth mirror 20.

After being charged (for example, to the positive polarity) by a primary charger 22, the drum 11 is slit-exposed to the image illuminated by the illuminating lamp 16, at the exposure station.

Simultaneously therewith, the drum 11 is subjected to the discharge of AC or the opposite polarity (for example, the negative polarity) from the polarity of the primary charge by a discharger 23, whereafter the drum is subjected to whole surface exposure by a whole surface exposure lamp 24, whereby an electrostatic latent image of high contrast is formed on the drum 11. The electrostatic image on the photosensitive drum 11 is visualized as a toner image by a developing unit 25. The method of development may use a liquid development, a magnetic brush development or the like, but in the present embodiment, the magnetic brush development is employed.

Transfer paper sheets 27-1 or 27-2 in a cassette 26-1 or 26-2 are fed into the apparatus by means of a paper feed roller 28-1 or 28-2 and given a rough timing by a first set of register rollers 29-1 or 29-2 and an accurate timing by a second set of register rollers 30, and then fed toward the photosensitive drum 11.

Next, the toner image on the drum 11 is transferred onto the transfer paper 27 as it passes between a transfer charger 31 and the drum 11.

After completion of the image transfer, the transfer paper is guided onto a conveyor belt 32, by which it is directed into between a pair of fixing rollers 33-1 and 33-2, where the image on the transfer paper is fixed by being pressed and heated, whereafter the transfer paper is discharged into a tray 34.

After the image transfer, the drum 11 is cleaned in its surface by a cleaning device 35 comprising a resilient blade, thus becoming ready for another cycle.

To control the above-described image formation cycle at various points of time, a drum clock pulse DCK is generated by a sensor 11b for optically detecting the clock point of a clock board 11a rotating with the rotation of the drum 11.

Designated by 50 is a surface potentiometer for detecting the surface potential of the drum 11. The surface potentiometer 50 is attached to the developing unit 25.

Figure 2:
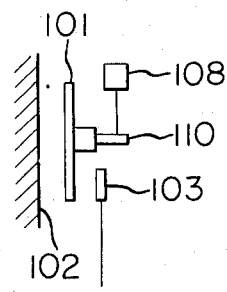
FIG. 2 is a schematic view of a first embodiment of the potentiometer according to the present invention.
Figure 3:
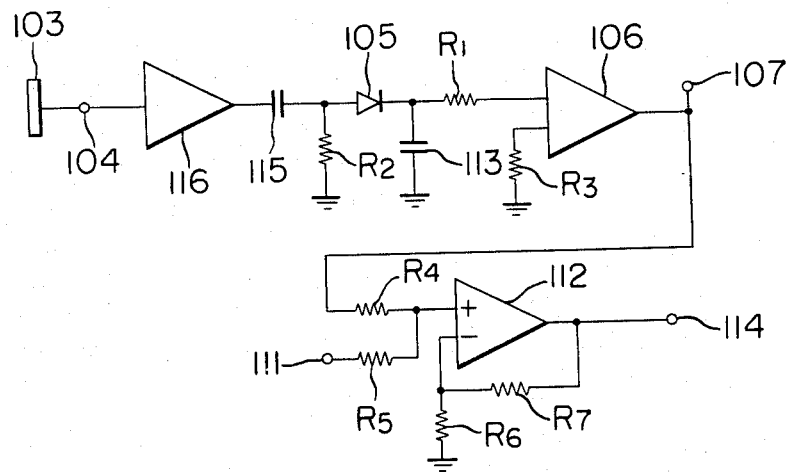
FIG. 3 shows, in a schematic diagram, a first surface potential detecting circuit.

An example of the rotatable chopper type surface potentiometer suitable for the control of the electrophotographic copying apparatus is shown in FIG. 2 and a measurement circuit is shown in FIG. 3. Designated by 101 is a rotatable chopper blade as shielding means for intermittently shielding the electric field between a surface to be measured 102 and a measurement electrode 103 to convert the electrostatic field based on the surface potential of the measured surface 102 into an alternating current and induce such current in the measurement electrode 103. Denoted by 108 is a DC source as bias applying means for applying a predetermined bias voltage to the chopper blade 101. Designated by 110 is the rotary shaft of the chopper blade 101 which is connected to drive means, such as a motor, not shown. A high impedance AC signal based on the difference in potential between the measured surface and the chopper is induced in the measurement electrode 103.

A minute AC signal induced in the measurement electrode 103 is converted and amplified into a low impedance signal by an amplifier circuit 116 for effecting impedance conversion which is formed as by a field effect transistor (FET) or the like, and the output thereof is rectified by a rectifying diode 105. The rectified output is smoothed by a capacitor 113 and a high impedance amplifier 106. An inverted form of the voltage which will be put out at a terminal 107 when the potential of the measured surface 102 is tentatively zero volt is applied to a terminal 111. The operational amplifier 112 adds together the smoothed output and the output of the terminal 111 so that the output voltage at an output terminal 114 is zero volt when the potential of the measured surface is zero volt. That is, the amplifier circuit subtracts the voltage corresponding to the output of bias voltage $V_B$ from the rectified and smoothed output.

Figure 4:
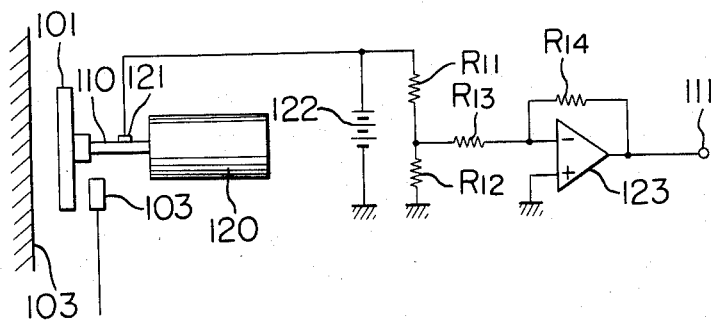
FIG. 4 shows a bias voltage source circuit.

The voltage applied to the terminal 111 may be provided by the circuit as shown, for example, in FIG. 4. Numeral 122 denotes a power source for the bias applying means 108, and 121 designates a brush which applies a bias voltage $V_B$ to the chopper blade 101 through the rotary shaft 110. The bias voltage $V_B$ is divided into a predetermined ratio by divider resistors R11 and R12, and inverted and amplified by an operational amplifier 123 at a ratio determined by resistors R13 and R14.

The resistance values of the resistors R11, R12, R13 and R14 are selected so as to be equal to the inverted value of the voltage which appears at the terminal 107 when the voltage of the measured surface 102 is zero volt. When the potential of the measured surface is zero volt, the output voltage of the output terminal 114 becomes zero volt, thus enabling discrimination between the positive and the negative of the potential of the measured surface.

Figure 5:
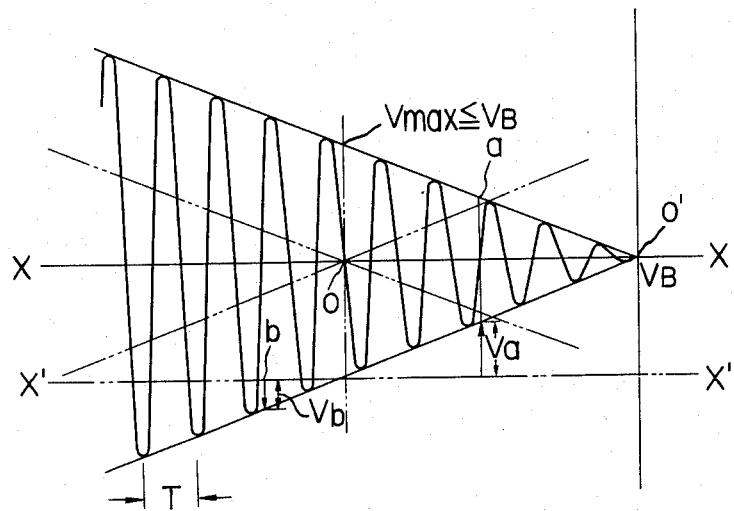
FIG. 5 illustrates the waveform of the measuring voltage.

Reference is now had to FIG. 5 to describe the measurement waveform of the surface potential. In FIG. 5, the abscissa represents the potential of the measured surface and the ordinate represents the measured potential. According to the prior art, when the potential of the rotatable chopper is biased to the earth potential (point O), the surface potential which is the same in absolute value or magnitude but differs in polarity is detected by the same voltage so that it has been impossible to discriminate between the polarities. However, when the bias voltage $V_B$ is applied to the chopper, the zero point of the voltage induced in the measurement electrode 103 is shifted to point O'. Since, here, the bias voltage $V_B$ is set to a value greater than or equal to the maximum value Vmax of the surface potential $V_P$ measured, the surface potential $V_P$ is always less than the bias voltage $V_B$. Therefore, it becomes possible to detect the surface potential by a different voltage even when the surface potential $V_P$ differs in sign but is identical in magnitude. Here, the bias voltage $V_B$ is of the positive value, but if it is of the negative value, measurement is possible by setting the bias voltage $V_B$ to a value less than or equal to the minimum value Vmin of the surface potential.

Further, the output of the high input impedance amplifier 106 and the output of the terminal 111 are added together. This results in parallel movement of line X—X to the position X'—X'. That is, when the surface potential $V_P$ is equal to the ground potential, the voltage put out from the terminal 107, namely, the voltage corresponding to the output of the bias voltage, is subtracted. With such construction, it is possible to detect a positive surface potential at positive value and to detect a negative surface potential at a negative value. That is, a surface potential which differs in polarity is measured at a detection value which differs in polarity. Thus, for example, assuming that the potential of the measured surface is a potential of point a, there is provided a DC voltage of +Va at the terminal 114. Also, when the potential of the measured surface is a potential of point b, there is provided a DC voltage of −Vb at the terminal 114.

Figure 6:
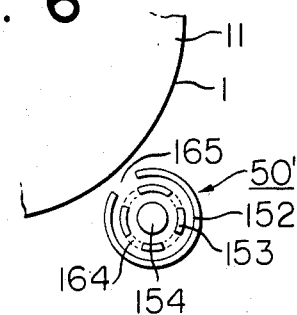
FIG. 6 is a transverse sectional view showing a second embodiment of the potentiometer according to the present invention.
Figure 7:
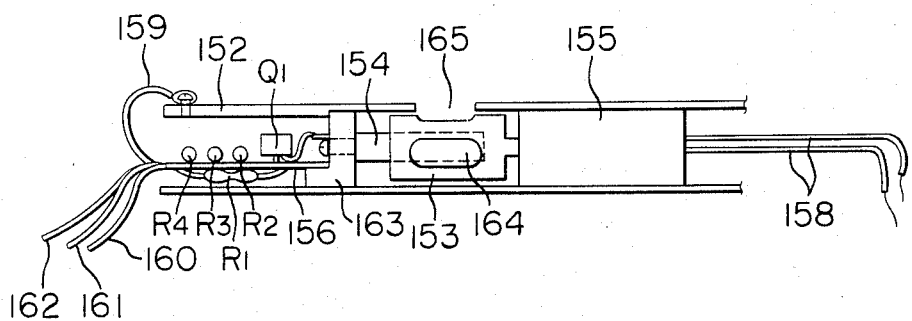
FIG. 7 is a side sectional view of the second embodiment.
Figure 8:
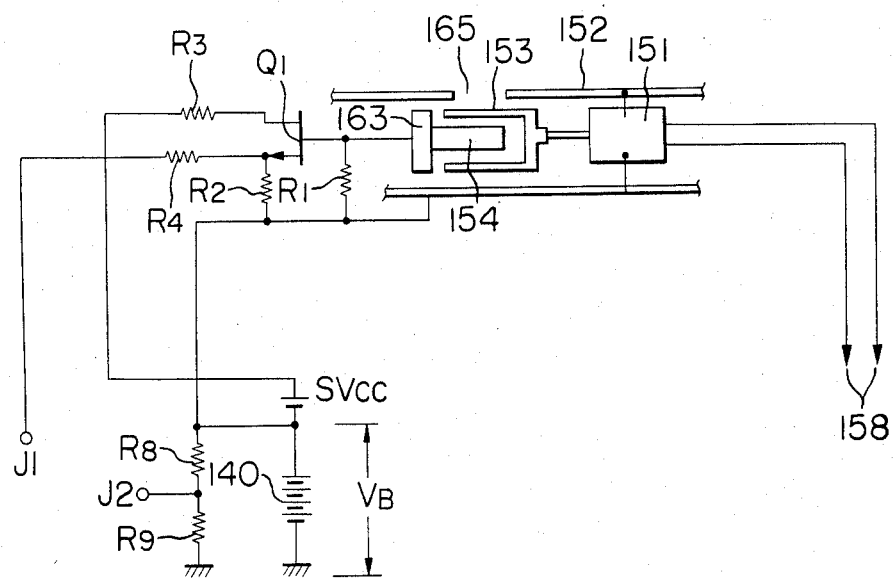
FIG. 8 shows a second surface potential detecting circuit.
Figure 9:
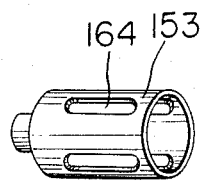
FIG. 9 is a perspective view showing a cage-shaped chopper 153.

A second embodiment of the present invention will now be described. FIG. 6 is a cross-sectional view showing the mounted positions of a surface potentiometer 50' and the drum 11; FIG. 7 is a side sectional view of the surface potentiometer 50'; FIG. 8 shows a surface potential detecting circuit; and FIG. 9 is a perspective view of a cage-shaped chopper 153 shielding the measured surface and the measurement electrode.

In FIGS. 6, 7 and 8, reference numeral 152 designates a conductive outer cylinder formed of brass or aluminum. The outer cylinder 152 has a surface charge detecting window 165. Designated by 55 is a sensor motor as drive means for rotating a chopper 153 which is conductive and cylindrical and has a measurement window 164. Denoted by 154 is a surface potential measurement electrode, and 156 a preamplifier printed plate forming a detecting circuit for detecting the output of the electrode 154.

Figures 1, 10:
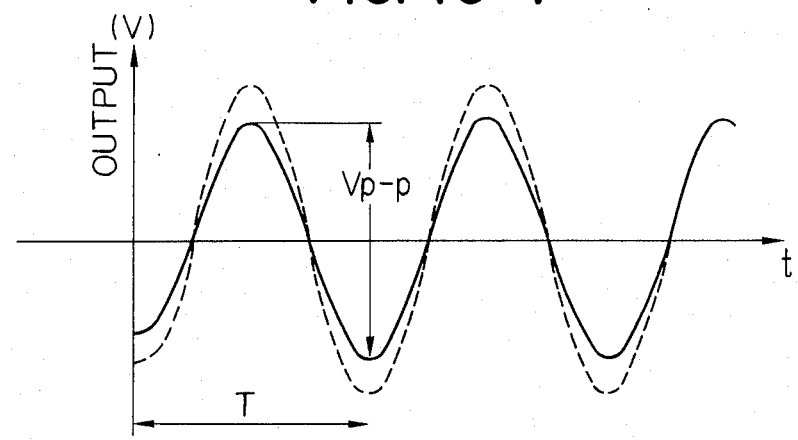
Figures 2, 10:
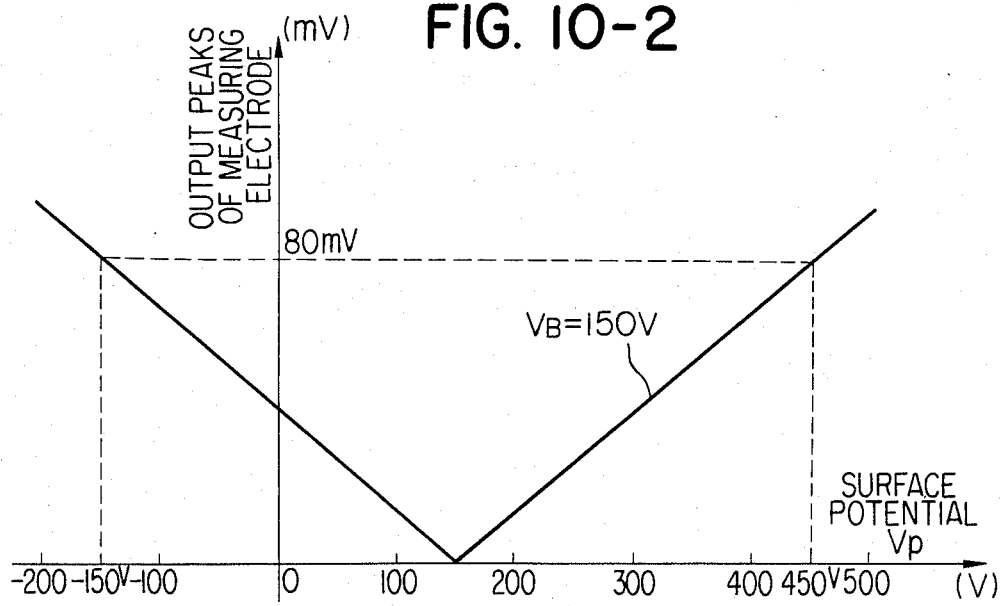

The surface potentiometer 150 is mounted at a distance of 2 mm from the drum surface which is the surface to be measured, with the charge detecting window 165 opposed to the drum surface, and the preamplifier printed plate 156 for amplifying the voltage detected by the electrode 154 is contained and integrally formed within the surface potentiometer 150. As the sensor motor 155 runs, the charge on the drum surface is induced in the electrode 154 through the potential measurement window 164. Four such potential measurement windows 164 are formed equidistantly on the chopper 153. The charge is induced in the electrode 154 because the chopper 153 is rotated to shield the drum surface and the electrode 154 at uniform intervals, and such induced charge provides an AC voltage as shown in FIG. 10-1. The period T of this AC voltage is $$T = \frac{1}{\text{r.p.m. of sensor motor} \times 4}.$$

Also, the amplitude $V_{P-P}$ of this voltage is proportional to the difference between the drum potential $V_P$ and the bias voltage $V_B$ which provides the reference voltage of the potential outer cylinder 152, the chopper blade 153 and the printed plate 156. Thus, the AC voltage becomes zero when $V_{P-P} = V_B$. The internal circuit provided within the printed plate 156 is driven by the sensor voltage source $SV_{CC}$ superposed on the aforementioned bias voltage $V_B$, and a junction type FET Q1 which is effecting impedance conversion of the AC conversion signal detected by the electrode 154 receives a minute AC signal at the high input resistor of the gate and converts the same into a low impedance signal. Denoted by R3 and R4 are protective resistors.

FIG. 10-2 illustrates the relation between the drum potential $V_P$ with the bias voltage $V_B$ as the parameter and the peak value of the output from the preamplifier. The output from the preamplifier is such that the difference between the drum potential $V_P$ and the bias voltage $V_B$ is faithfully detected. Further, if the drum potential $V_P$ is varied within one of the range $V_P \geq V_B$ or $V_P \leq V_B$, the AC detection voltage has a monotonously increasing or a monotonously decreasing characteristic depending on the drum potential $V_P$, thus eliminating the need to newly provide a synchronizing-rectifying circuit for determining the polarity. In FIG. 10-2, if $V_B$ is 150 volts and when the drum potential $V_P$ is in the range of $V_P \leq 150$ volts, the detection voltage is monotonously increased in the range of $-n$ volts to $+150$ volts, thus enabling the magnitude relationship in the positive and negative directions to be determined. However, the maximum value of the $V_P$ in its positive range is 150 volts, and $-n$ volts is limited by the saturation voltage of the circuit provided in the printed plate 156.

As described above, a positive or negative predetermined bias is applied to the potentiometer housing and the internal circuit contained in the potentiometer so that the bias is varied in a range either greater or smaller than the bias voltage, thereby enabling the polarity of the potential of the measured surface to be determined. Such a construction not only eliminates the need to newly provide a synchronizing-detecting circuit or the like but also makes it possible to prevent fluctuation of the measured potential which would otherwise result from noise affecting the internal circuit of the potentiometer.

Figure 11:
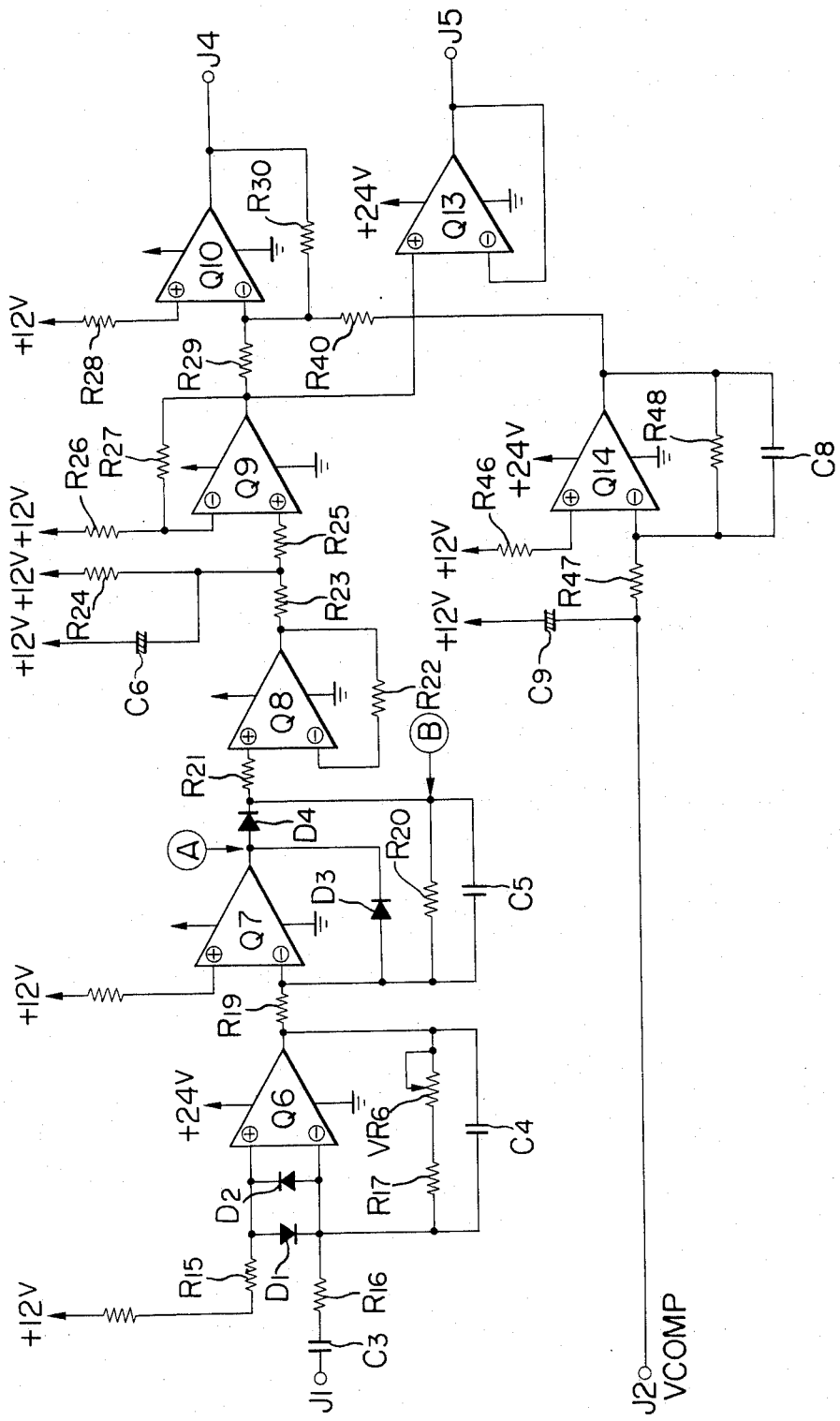
FIG. 11 shows, in a schematic diagram, a processor circuit for detected voltage.

Reference is now had to the circuit of FIG. 11 and the waveform of FIG. 12 to describe the processing of the AC voltage put out at a terminal J1. The AC voltage waveform detected by the potentiometer 50' is applied from J1 to a coupling capacitor C3 and AC amplified by an amplifier Q6 into an amplified AC signal with $+12$ volts as the center. Denoted by VR6 is a detection gain adjusting variable resistor.

Thereafter, the AC voltage has only the positive component thereof with $+12$ volts as the center linearly amplified by a linear detecting circuit comprising an operational amplifier Q7, diodes D3 and D4, and a resistor R20. When the input voltage of the inverting input terminal of the operational amplifier Q7 is positive with respect to the input voltage of the non-inverting input terminal thereof, the point Ⓐ becomes negative and the diode D4 is turned off while the diode D3 is turned on. Since the negative input terminal of the operational amplifier Q7 becomes $\pm 12$ volts by the turn-on of the diode D3, the output (point B) assumes $+12$ volts. Also, when the input voltage of the inverting input terminal of the operational amplifier Q7 is negative with respect to the input voltage of the non-inverting input terminal thereof, the point Ⓐ becomes positive and the diode D4 is turned on while the diode D3 is turned off, so that the gain becomes $-R20/R19$ and is linearly amplified and detected. The use of such a linear detecting circuit leads to improved linearity of the DC regeneration voltage characteristic for the surface potential of the drum and to sufficient compensation for temperature.

Figure 12A:
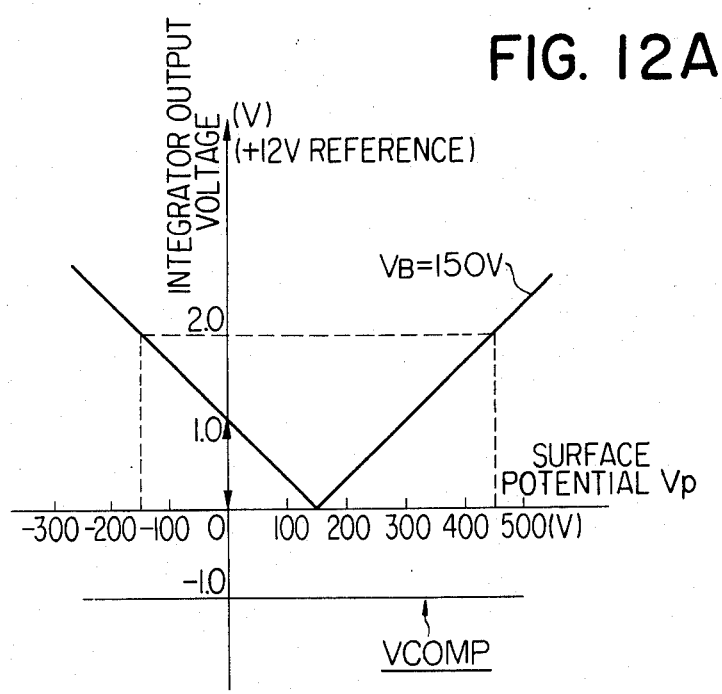
FIGS. 12A and 12B illustrate the relations between the surface potential $V_P$ and the output at the points of the circuit shown in FIG. 11.
Figure 12B:
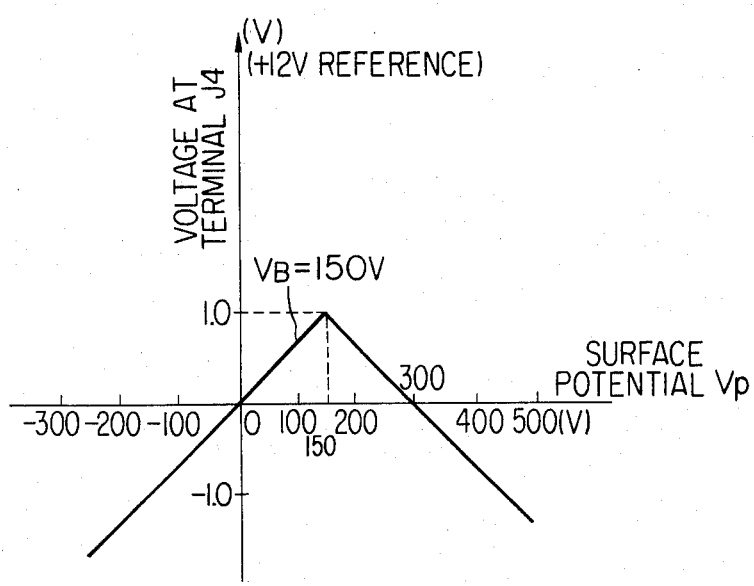
Figure 13:
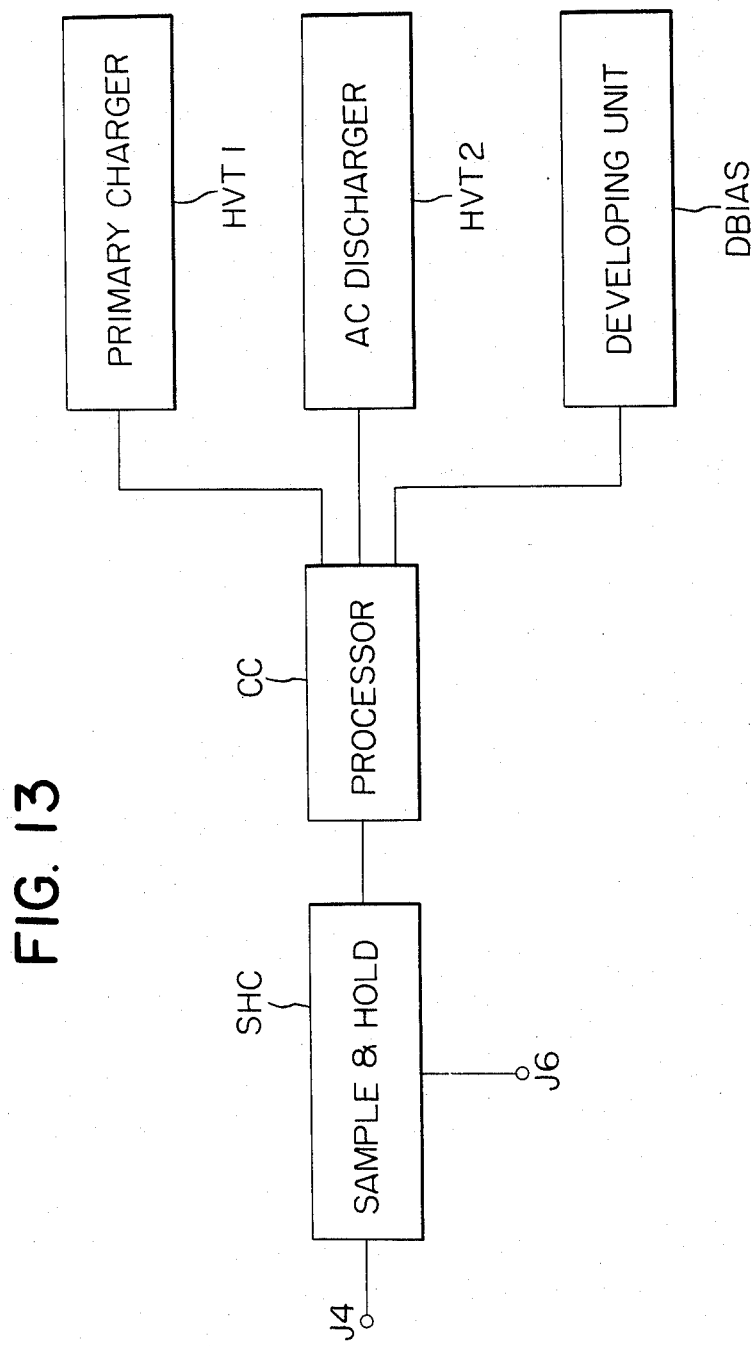
FIG. 13 is a schematic block diagram showing a control circuit.

The detected signal is passed through a buffer amplifier comprising an operational amplifier Q8 and smoothed by a smoothing capacitor C6. The signal is further amplified by a buffer amplifier Q9. The signal therefrom is put out as a potential setting check terminal J5 through a voltage follower Q13. The relation between the output of J5, namely, the integrated output, and the surface potential of the drum has a symmetrical characteristic about the bias voltage $V_B$, as shown in FIG. 12A. A voltage $V_{COMP}$ resulting from the bias voltage $V_B$ from the terminal J2 being divided by resistors R8 and R9 is applied to the inverting input terminal of an addition amplifier Q10 and it is $+1$ volt (reference $+12$ volts) in the present embodiment. The sensor bias compensating voltage $V_{COMP}$ is inverted in polarity by an operational amplifier Q14 and provides one input of the addition amplifier Q10 at $-1$ volt (reference $+12$ volts). The output of Q10 exhibits such a characteristic as shown in FIG. 12B. Therefore, the sensor bias compensating voltage $V_{COMP}$ functions to level-shift and eliminate any offset by being multiplied by the bias voltage $V_B$ such that the DC-regenerated detection output is zero volt (reference $+12$ volts) when the surface potential of the drum is zero volt, and to determine the positive or the negative of the potential. Also, variation in the bias voltage $V_B$ functions to offset the variation in the DC-regenerated detection output. That is, the variation in the bias voltage is offset by adding a voltage resistor-divided from the bias voltage applied to the potentiometer housing to the DC-regenerated measurement output of the potentiometer and this leads to the possibility of stable measurement. The present invention is not restricted to the cage-shaped potentiometer of the present embodiment but is applicable to any potentiometer of the type which takes out the potential of a measured surface as AC signal and DC-regenerates the same. The signal put out at the terminal J4 may control copying apparatus or the like by a control circuit as shown in FIG. 13.

The signal applied from the terminal J4 is held by a sampling signal applied from a known sample hold circuit SHC to a terminal J6, and the signal so held is processed into a control signal by a processing circuit CC to process the primary charger HVT1, the AC discharger HVT2 and the development bias DBIAS.

As has hitherto been described, the present invention can measure the surface potential of a measured surface by converting it into an alternating current by a very simple means for applying the bias voltage $V_B$ to the chopper and can discriminate between the positive and the negative of the surface potential However, if, for example, a positive bias potential $V_B$ is applied, the potentiometer of the present invention cannot measure any positive potential greater than the bias voltage. Therefore, it is to be understood that the bias voltage $V_B$ is equal to or greater than the maximum potential Vmax to be measured. This also holds true of the negative bias potential.

What we claim is:

1. A surface potentiometer comprising:
   a measurement electrode in which voltage corresponding to a surface potential of a surface to be measured is induced, wherein said electrode is capable of measuring a surface potential which is varied between positive and negative values;
   chopper means for intermittently chopping an electric field between the surface to be measured and the measurement electrode to induce an AC voltage in said measurement electrode;
   bias applying means for applying to said chopper means, as a predetermined bias voltage, either one of a voltage greater than or equal to a maximum value of the surface potential of the surface to be measured, or a voltage smaller than or equal to a minimum value of the surface voltage, wherein said electrode produces a voltage corresponding to the difference between a surface potential of said surface to be measured and said bias voltage, and said electrode provides unlike voltage outputs for surface potentials having like absolute values but unlike polarities;
   rectifier means for rectifying the voltage induced in said measurement electrode; and
   operational means coupled to said rectifier means for subtracting from the rectified voltage of said rectifier means a voltage corresponding to said bias voltage.

2. A potentiometer according to claim 1, wherein said rectifier means comprises a linear detecting circuit.

3. A potentiometer according to claim 1, further comprising drive means for rotating said chopper means.

4. A potentiometer according to claim 1, further comprising impedance converting means for converting the AC voltage induced in said measurement electrode into a low impedance signal.

5. A potentiometer according to claim 1, wherein said chopper means is formed into a hollow cylindrical shape, and said measurement electrode is disposed in the hollow of said chopper means.

6. A potentiometer according to claim 5, further comprising a housing surrounding said chopper means.

7. A potentiometer according to claim 6, wherein said predetermined bias voltage is also applied to said housing.

8. A surface potentiometer according to claim 1, wherein said operational means includes means for producing said corresponding voltage from the voltage resulting from dividing said bias voltage into a predetermined ratio.

9. Image formation apparatus comprising:
   image forming means for forming an image on a surface of a recording medium;
   detector means for detecting a surface potential of said recording medium surface, wherein said detector means comprises a measurement electrode in which a voltage corresponding to a surface potential of a surface to be measured is induced, and shield means for intermittently shielding a clearance between the surface to be measured and the measurement electrode to induce an AC voltage in said measurement electrode;
   bias applying means for applying a predetermined bias voltage to said shield means;
   linear detecting means for linearly amplifying said AC voltage in said measurement electrode, said linear detecting means linearly amplifying and detecting either one of a positive or negative component of said AC voltage;
   compensating means for compensating for the output of said linear detecting means in response to said predetermined bias voltage produced from said bias applying means, wherein said compensation means comprises operational means for subtracting from the output of said linear detecting means a compensating voltage corresponding to said predetermined bias voltage to determine the polarity of a surface potential detected by said detector means; and
   control means for controlling said image forming means in response to an output of said compensating means to normalize image forming conditions.

10. Apparatus according to claim 9, wherein said detector means comprises a measurement electrode, and a chopper for intermittently shielding a clearance between said recording medium and said measurement electrode.

11. Apparatus according to claim 10, wherein said detector means has converter means for converting a high impedance signal induced in said measurement electrode into a low impedance signal.

12. Apparatus according to claim 10, wherein said detector means has a rotatively driving means for rotating said chopper.

13. Apparatus according to claim 9, 10, 11, or 12, wherein said image forming means includes charging means and developing means.

14. Image formation apparatus according to claim 9, wherein said predetermined bias voltage corresponds to either one of a voltage greater than or equal to a maximum value of the surface potential of the surface to be measured or a voltage smaller than or equal to a minimum value of the surface voltage which permits a determination of the polarity of surface potential.

15. Image formation apparatus according to claim 9, wherein said linear detecting means comprises:
   an operational amplifier having input and output ports, and having its said input port coupled to said detector means;
   a rectifier element connected to the output port of said operational amplifier; and
   a feedback circuit connected between an output of said rectifier element and the input port of said operational amplifier.

16. Image formation apparatus according to claim 15, wherein said compensating means comprises operational means for subtracting from the output of said linear detecting means a compensating voltage corresponding to said predetermined bias voltage.

17. Image formation apparatus according to claim 16, wherein said compensating voltage is obtained by dividing said bias voltage.

18. Electrostatic recording apparatus comprising:
   a photosensitive body;
   means for forming an electrostatic latent image on said photosensitive body, said means including charging means for charging said photosensitive body with one electric polarity, exposure means for exposing said photosensitive body, and discharging means for discharging said photosensitive body with alternating current or an electric polarity opposite to said one electric polarity concurrently with exposure by said exposure means;
   developer means for developing the latent image;
   a measurement electrode provided adjacent to said photosensitive body for measuring a surface potential of said latent image, wherein said electrode is capable of measuring a surface potential which is varied between positive and negative values;
   chopper means for intermittently chopping an electric field between said measurement electrode and said photosensitive body;
   driving means for driving said chopper means to induce an AC signal in said measurement electrode;
   bias applying means for applying to said chopper means as a predetermined bias voltage, either one of a voltage greater than or equal to a maximum value of the surface potential of said photosensitive body, or a voltage smaller than or equal to a minimum value of the surface potential, wherein said electrode produces a voltage corresponding to the difference between a surface potential of said surface to be measured and said bias voltage, and said electrode provides unlike voltage outputs for surface potentials having like absolute values but unlike polarities;
   rectifier means for rectifying the voltage induced in said measurement electrode; and
   operational means coupled to said rectifier means for subtracting from the rectified voltage of said rectifier means a voltage corresponding to said bias voltage.

19. Apparatus according to claim 18, wherein said chopper means is formed into a hollow cylindrical shape, and said measurement electrode is disposed in the hollow of said chopper means.

20. Apparatus according to claim 19, further cmprising a housing surrounding said chopper means.

21. Apparatus according to claim 20, wherein said housing is formed of a conductive material and said bias voltage is also applied to said housing.

* * * * *